(12) United States Patent
Wang et al.

(10) Patent No.: US 12,482,777 B2
(45) Date of Patent: Nov. 25, 2025

(54) COPPER PILLAR BUMP STRUCTURE AND METHOD OF MANUFACTURING THE SAME

(71) Applicant: UNITED MICROELECTRONICS CORP., Hsin-Chu (TW)

(72) Inventors: Chen-Hsiao Wang, Hsinchu (TW); Kai-Kuang Ho, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 459 days.

(21) Appl. No.: 17/898,478

(22) Filed: Aug. 29, 2022

(65) Prior Publication Data

US 2024/0014158 A1    Jan. 11, 2024

(30) Foreign Application Priority Data

Jul. 8, 2022   (TW) .................................. 111125647

(51) Int. Cl.
*H01L 23/00*   (2006.01)
*H01L 21/48*   (2006.01)
(Continued)

(52) U.S. Cl.
CPC .......... *H01L 24/13* (2013.01); *H01L 21/4853* (2013.01); *H01L 21/4857* (2013.01);
(Continued)

(58) Field of Classification Search
CPC . H01L 21/13; H01L 21/4853; H01L 21/4857; H01L 23/3192; H01L 23/49816; H01L 23/49838; H01L 24/05; H01L 24/11; H01L 24/12; H01L 2224/0212; H01L 2224/02122; H01L 2224/0391; H01L 2224/0401; H01L 2224/10; H01L 2224/1012; H01L 2224/13; H01L 2224/81
See application file for complete search history.

(56) References Cited

U.S. PATENT DOCUMENTS 9,087,732 B1    7/2015  Xu
2003/0214795 A1*  11/2003  Sakuyama .............. H01L 24/05
                                                                361/767
(Continued)

FOREIGN PATENT DOCUMENTS

TW    201133748 A1   10/2011
TW    201814842 A     4/2018
WO    2005/062998 A2  7/2005

*Primary Examiner* — Wael M Fahmy
*Assistant Examiner* — Shamita S. Hanumasagar
(74) *Attorney, Agent, or Firm* — Winston Hsu

(57) ABSTRACT

A copper pillar bump (CPB) structure is provided in the present invention, including a substrate, a pad on the substrate, a passivation layer covering the substrate and exposing the pad, and a copper pillar on the passivation layer and the pad and connecting directly with the pad. The copper pillar is provided with an upper part and a lower part, and a top surface of the lower part includes a first top surface and a second top surface. The second top surface is on one side of the first top surface, and the upper part of the copper pillar is on the first top surface of the lower part. A metal bump is on the copper pillar, wherein parts of the metal bump directly contact the second top surface of the lower part.

6 Claims, 10 Drawing Sheets

(51) Int. Cl.
*H01L 21/56* (2006.01)
*H01L 23/31* (2006.01)
*H01L 23/498* (2006.01)

(52) U.S. Cl.
CPC .. *H01L 23/49816* (2013.01); *H01L 23/49838* (2013.01); *H01L 23/49866* (2013.01); *H01L 24/11* (2013.01); H01L 21/563 (2013.01); H01L 23/3171 (2013.01); H01L 2224/11462 (2013.01); H01L 2224/13006 (2013.01); H01L 2224/13011 (2013.01); H01L 2224/13014 (2013.01); H01L 2224/13017 (2013.01); H01L 2224/13018 (2013.01); H01L 2224/13082 (2013.01); H01L 2224/13147 (2013.01); H01L 2224/13541 (2013.01); H01L 2224/13552 (2013.01); H01L 2224/13564 (2013.01); H01L 2224/1357 (2013.01); H01L 2224/13611 (2013.01); H01L 2924/35121 (2013.01)

(56) References Cited

U.S. PATENT DOCUMENTS

2014/0070401 A1   3/2014   Daubenspeck
2021/0217703 A1*  7/2021   Chuang ............. H01L 23/53238

* cited by examiner

COPPER PILLAR BUMP STRUCTURE AND METHOD OF MANUFACTURING THE SAME

BACKGROUND OF THE INVENTION

1. Field of the Invention

The present invention relates generally to a copper pillar bump (CPB) structure, and more specifically, to a copper pillar bump structure with parts of the copper pillar replaced by metal bump.

2. Description of the Prior Art

Copper pillar bump (CPB) is a technology of manufacturing solder bump on the surface of flip chip package to provide functions like electrical and thermal conductivity and prevent electron migration. Different from conventional solder bump technology, copper pillar bump mainly use the copper pillar as a conductive subject to improve signal transduction and reliability. Furthermore, every heat-dissipating copper pillar bump functions like a micro solid state heat pump, with better thermal conductivity to provide novel heat transmission method for electronic products. In addition, fine pitch between copper pillar bumps may be scaled down to 40 μm, so that the capacity for the flip chip package on carrier substrates and modules may be increased, and the copper pillar structure may be integrated directly as a part of standard flip chip package, or may be combined with electrical bumps (for power, grounding and signaling), similar to the components like transistors, resistors and capacitors integrated in circuit design, in order to be applied in the field of system integration or system in a package (SiP). The product suitable for the copper pillar bump includes DRAM, logic products like memory controller, FPGA, WiFi, RF switch IC, power management IC, surface acoustic wave filter, bulk acoustic wave filter and LED, etc.

Despite the aforementioned advantages of copper pillar bump technology, in comparison to conventional solder bump method, larger stress will be induced in the packaging using copper pillar due to the difference of coefficients of thermal expansion between package substrate and chip. Adjacent vulnerable layer structures (ex. porous ultra-low k dielectric layer) would suffer delamination or crack issue during reflow process or thermal cycling test, thereby impacting the quality and reliability of flip chip package. Accordingly, those of ordinarily skilled in the art still need to improve the structure of current copper pillar bump in order to solve the aforementioned problem.

SUMMARY OF THE INVENTION

In the light of the aforementioned shortcomings of current conventional skills, the present invention hereby provides a novel copper pillar bump (CPB) structure, with feature of parts of the original copper pillar in the copper pillar bump replaced by metal bump, so as to absorb excess stress through the metal bump and prevent the delamination or crack of adjacent vulnerable layer structures.

One aspect of the present invention is to provide a copper pillar bump structure, including a substrate, a bonding pad on the substrate, a passivation layer covering the substrate and exposing the bonding pad, a copper pillar on the passivation layer and the bonding pad and connecting directly with the bonding pad, wherein the copper pillar is provided with an upper part and a lower part, an upper surface of the lower part is consisted of a first upper surface and a second upper surface, and the second upper surface is at one side of the first upper surface, and the upper part of the copper pillar is on the first upper surface of the lower part, and a metal bump on the copper pillar, wherein parts of the metal bump directly contact the second upper surface of the lower part of copper pillar.

Another aspect of the present invention is to provide a method of manufacturing a copper pillar bump structure, including steps of providing a substrate with a bonding pad and a passivation layer thereon exposing the bonding pad, forming a first photoresist on the passivation layer, wherein the first photoresist has a first copper pillar pattern exposing the bonding pad, performing a first electroplating process using the first photoresist as a mask to form a lower copper pillar connecting the bonding pad, removing the first photoresist and forming a second photoresist on the passivation layer, wherein the second photoresist has a second copper pillar pattern exposing parts of the lower copper pillar, performing a second electroplating process using the second photoresist as a mask to form an upper copper pillar connecting the lower copper pillar, removing the second photoresist and forming a third photoresist on the passivation layer, wherein the third photoresist has a metal pattern exposing the upper copper pillar and the parts of the lower copper pillar, and performing a third electroplating process using the third photoresist as a mask to form a metal bump on the upper copper pillar and the lower copper pillar.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
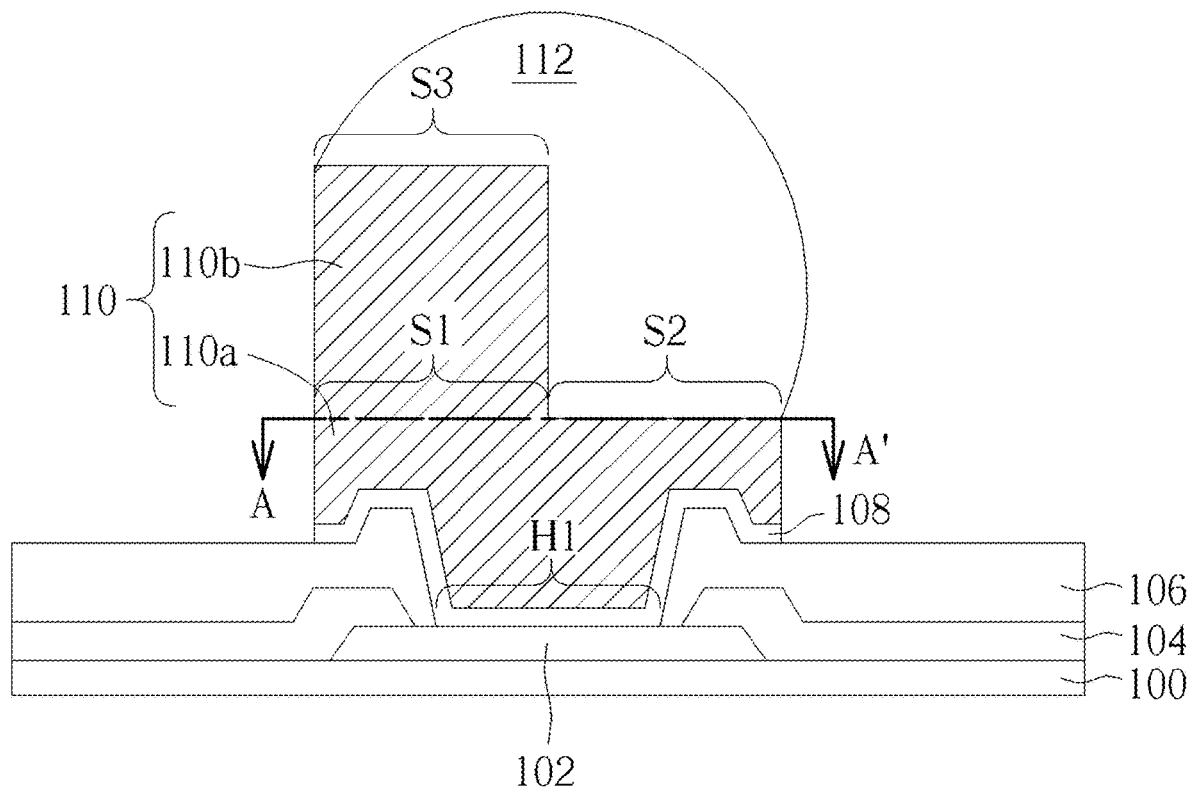
FIG. 1 and FIG. 1a are schematic cross-sections of a copper pillar bump structure in the preferred embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

In addition, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Please refer to FIG. 1, which is a schematic cross-section of a copper pillar bump structure in the preferred embodiment of present invention. The copper pillar bump structure of present invention includes a substrate 100. The substrate 100 may be a silicon substrate or silicon chip, with various components (ex. transistors, resistors, capacitors or memory) and interconnects (ex. conductive lines and vias) formed thereon through semiconductor processes. Since structure and composition of substrate 100 are not main points of the present invention, relevant details and features will be omitted in description and drawing, and the substrate 100 will be represented by single layer structure. A bonding pad 102 formed on the substrate 100. The bonding pad 102 may be an aluminum (Al) bonding pad, which is electrically connected with the interconnects (such as top metal layer) inside the substrate 100 to serve as an I/O terminal for the circuit. A passivation layer 104 and a polyimide (PI) layer 106 are formed sequentially on the bonding pad 102 and the substrate 100. Opening H1 is provided in the passivation layer 104 and the polyimide layer 106 to expose the bonding pad 102 below. The material of passivation layer 104 may be silicon nitride ($Si_3O_4$) or silicon oxide ($SiO_2$), which may provide protection and isolation effects for circuits on the surface of substrate 100. In addition, coefficients of thermal expansion of Si-based passivation layer 104 and substrate 100 are relatively close, thus the passivation layer 104 may function as a buffer layer between the polyimide layer 106 and the substrate 100. The material of polyimide layer 106 is polymer, with properties of low curing temperature and low flexural modulus suitable as an outermost protection layer for flip chip process.

Figure 1A:
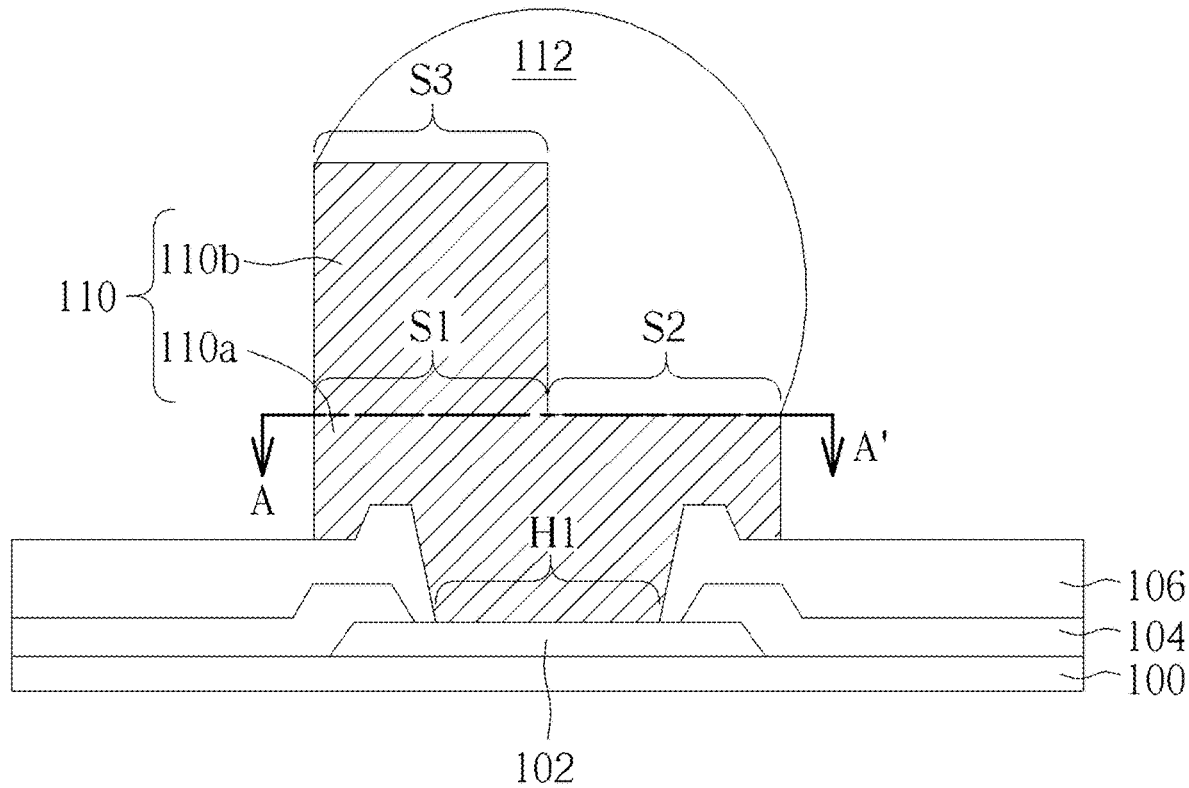

Refer still to FIG. 1. An under-bump metallization (UBM) layer 108 is formed on the polyimide layer 106 and the bonding pad 102, and the under-bump metallization layer 108 would directly contact the exposed bonding pad 102. The material of under-bump metallization layer 108 may be metal like chromium (Cr), copper (Cu), titanium (Ti) or nickel (Ni), or the alloy thereof, or the multilayer structure thereof, with the function of preventing copper ions in the copper pillar 110 from diffusing into and contaminating the bonding pad 102 or substrate 100 below during high-temperature reflow soldering process. At the same time, the under-bump metallization layer 108 may provide excellent adhesion effect for adjacent components. In other embodiment, as shown in FIG. 1a, the copper pillar bump structure may not include under-bump metallization layer 108, and the copper pillar 110 is connected directly with the bonding pad 102.

Refer still to FIG. 1. A copper pillar 110 is formed on the under-bump metallization layer 108. The copper pillar 110 completely overlaps the under-bump metallization layer 108 in a direction vertical to the substrate 100. In the embodiment of present invention, the copper pillar 110 consists of a lower part 110a and an upper part 110b. The lower part 110a of copper pillar 110 has an area the same as the one of horizontal surface of the copper pillar 110, which is consisted of a first upper surface S1 and a second upper surface S2. The second upper surface S2 is at one side of the first upper surface S1, wherein the upper part 110b is formed directly on the first upper surface S1, and the upper part 110b of copper pillar 110 completely overlaps the first upper surface S1 in a direction vertical to the substrate 100. As shown in the cross-section, the upper part 110b of copper pillar 110 protrudes on the lower part 110a, with its horizontal area smaller than the one of the lower part (i.e. the overall copper pillar) 110a.

Refer still to FIG. 1. A metal bump 112, such as a solder bump, is on the copper pillar 110 and directly contact therewith. In the embodiment of present invention, parts of the metal bump 112 directly contact the top surface S3 of upper part 110b of copper pillar 110, and parts of the metal bump 112 directly contact the second upper surface S2 of lower part 110a and the sidewalls of upper part 110b of copper pillar 110. In this way, in comparison to conventional skills, parts of the copper pillar 110 are replaced by the metal bump 112, so that the volume ratio of metal bump 112 in the whole copper pillar bump structure would be much larger than the one of solder bump in conventional skills. The advantage of the aforementioned design of present invention is that excess stress induced in reflow soldering process may be absorbed at one end of the metal bump of copper pillar bump structure through the metal bump 112 with increased volume and ratio, so as to prevent the delamination or crack of adjacent vulnerable layer structures (ex. porous ultra-low k dielectric layer below the bonding pad 102) or prevent the crack of polyimide layer 106. The material of metal bump 112 may be tin-lead alloy or lead-free eutectic alloy like tin-silver, tin-zinc or tin-copper alloy.

The copper pillar bump structure of present invention may be arranged in an array on the substrate surface. In later flip chip process, the bump end of copper pillar bump structure will be aligned and contacted with the bonding pad of other substrate to be boned therewith, and processes like reflow, under filling and curing will be performed to bond the substrate 100 onto other substrate through the copper pillar bump structure.

Figure 2A:
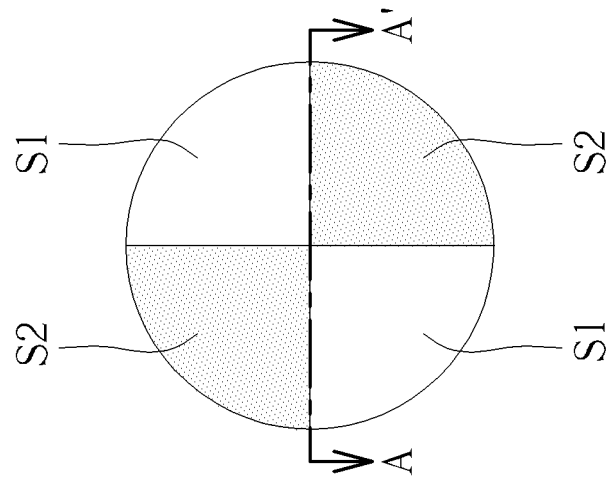
FIG. 2A, FIG. 2B and FIG. 2C are schematic top views of a copper pillar of the copper pillar bump structure in the preferred embodiment of the present invention.
Figure 2B:
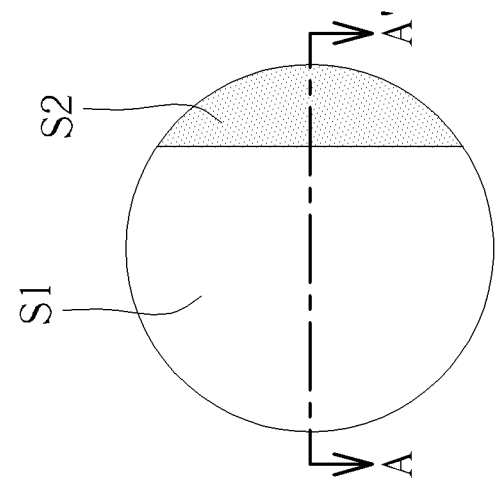
Figure 2C:
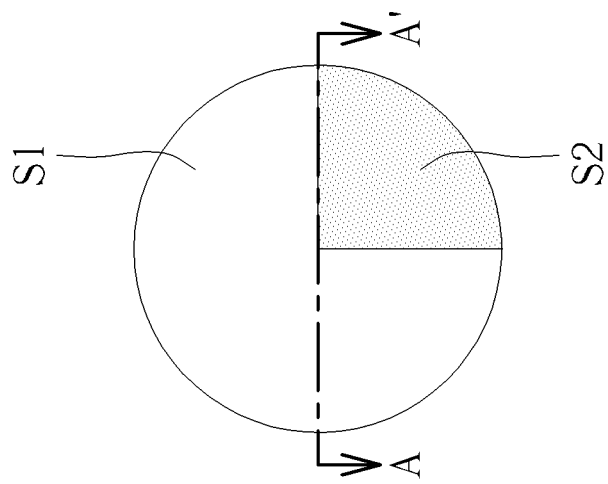

Please refer to FIG. 2A, FIG. 2B and FIG. 2C, which are schematic top views of a copper pillar of the copper pillar bump structure in the preferred embodiment of present invention. In the embodiment of present invention, the copper pillar 110 may vary in form or shape. In the case that the horizontal cross-section of copper pillar is circle, the area of second upper surface S2 of the lower part 110a not covered by the upper part 110b of copper pillar may be ¼ (quarter circle as shown in FIG. 2A, wherein the cross-section of copper pillar in FIG. 1 is taken along the section line A-A' in the figure) of the total area (i.e. the area of first upper surface S1 plus second upper surface S2) or may be ½ (two diagonally opposite quarter circles as shown in FIG. 2C) of the total area. Alternatively, the second upper surface S2 may be any surface abutting the circumference, but not be limited thereto. Please note that in the embodiment of present invention, the horizontal cross-section of copper pillar 110 is not limited to the circle shown in the figures. It may be any geometric shape, such as square.

Figure 3:
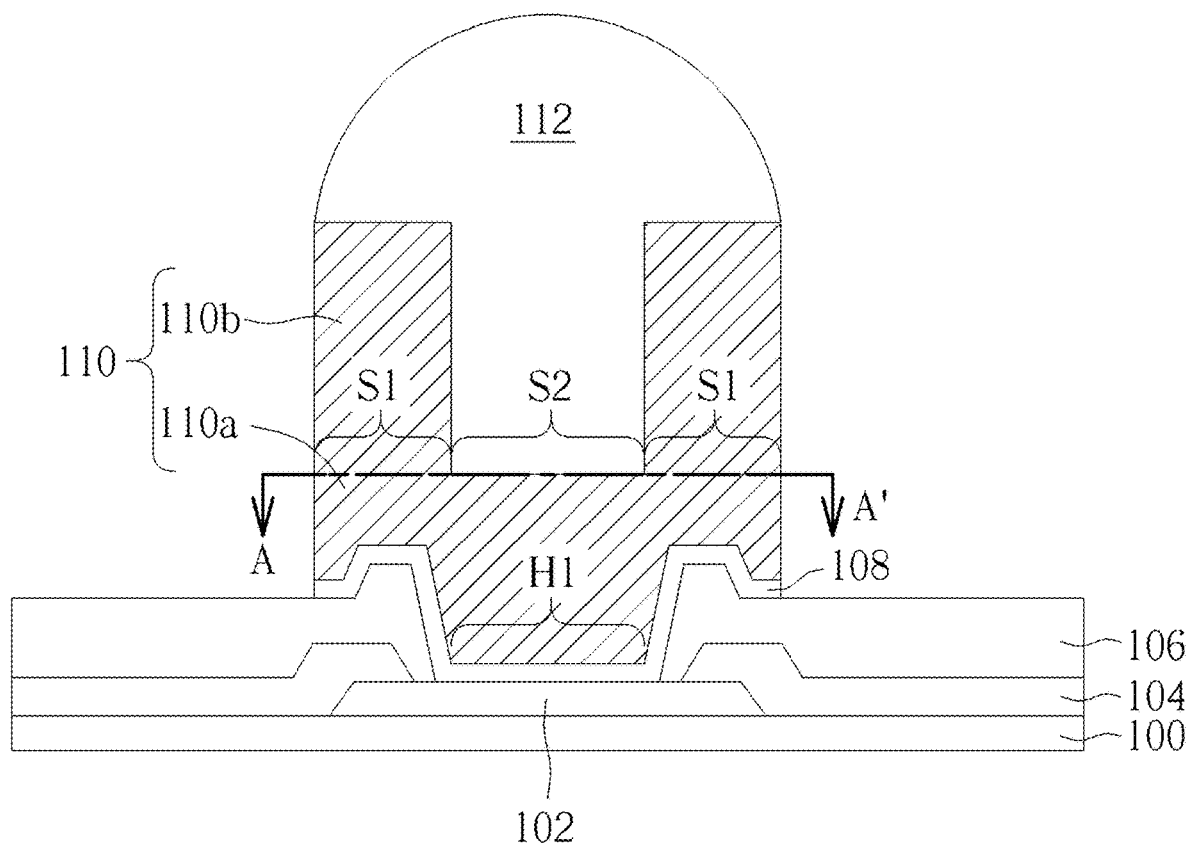
FIG. 3 is a schematic cross-section of a copper pillar bump structure in another embodiment of the present invention.
Figure 4:
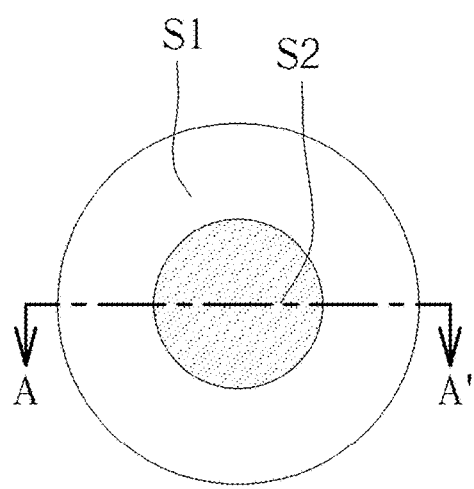
FIG. 4 is a schematic top view of a copper pillar of the copper pillar bump structure in another embodiment of the present invention.

Please refer collectively to FIG. 3 and FIG. 4, which are schematic cross-section of a copper pillar bump structure and schematic top view of the copper pillar in the copper pillar bump structure in another embodiment of the present invention. The cross-section of copper pillar in FIG. 3 is taken along the section line A-A' in FIG. 4. The structure of this embodiment is similar to the one of FIG. 1, with difference that the second upper surface S2 of lower part 110a of copper pillar 110 is the inner circle of concentric circle structure, and the upper part 110b of copper pillar 110 is in an annular form like a periphery wall of the copper pillar 110 distributed on the first upper surface S1 of the lower part 110a of copper pillar 110, wherein the radius of second upper surface S2 is preferably ½ to ⅔ of the outer radius of upper surface of the lower part 110a of copper pillar 110. In this way, a part of the metal bump 112 would extend downwardly and be embedded in the lower part 110a of copper pillar 110, thereby providing good adhesion and the ability to absorb stress. In other embodiment, the second upper surface S2 of the lower part 110a of copper pillar 110 may be the outer circle portion of concentric circle structure, while the first upper surface S1 is the inner circle portion of concentric circle structure.

Figure 5:
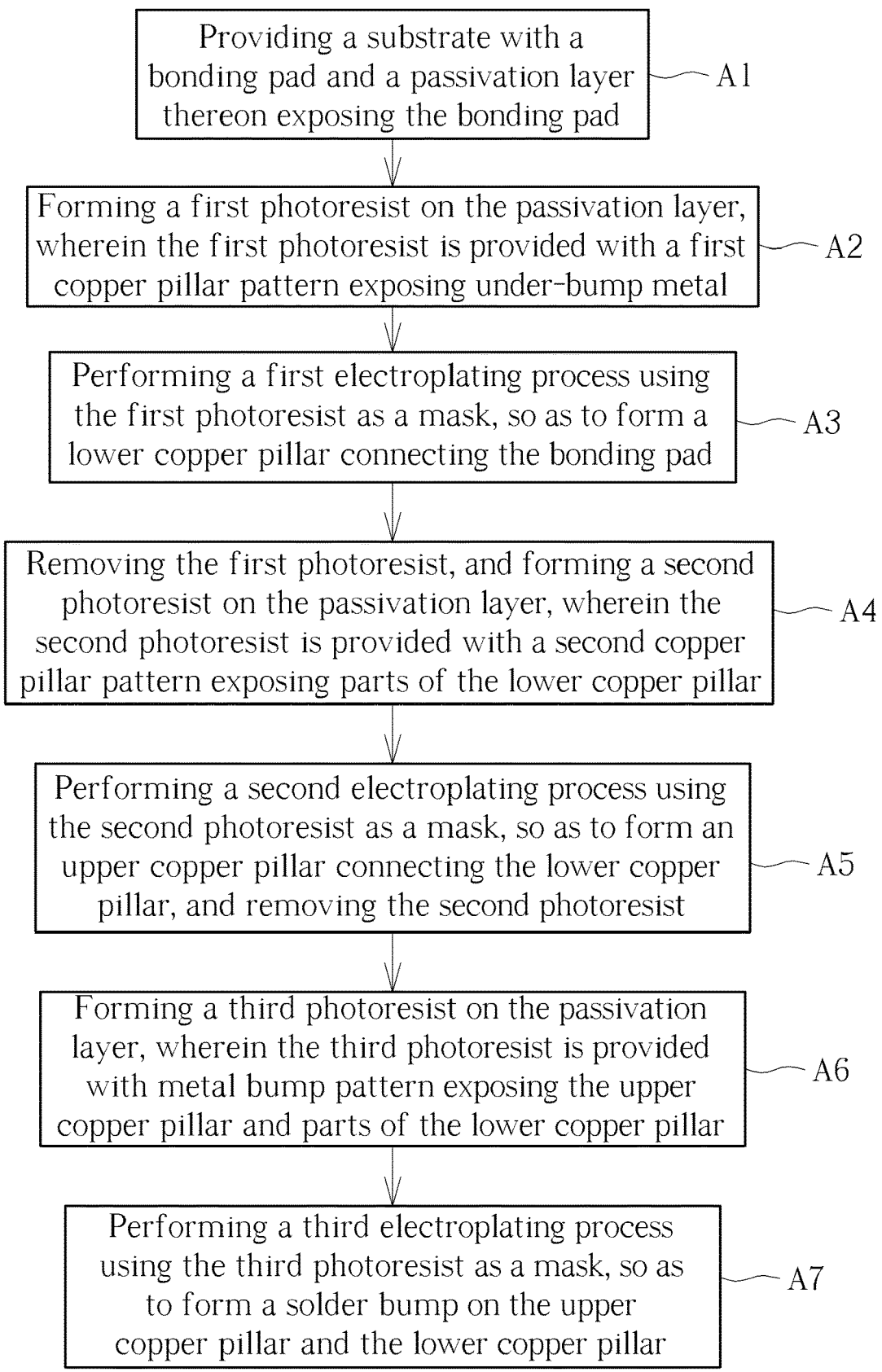
FIG. 5 is a block diagram of a method of manufacturing the copper pillar bump structure in the preferred embodiment of the present invention.

The method of manufacturing the copper pillar bump structure of present invention will now be described with reference to the block diagram of FIG. 5 in following embodiments, and schematic cross-sections of FIG. 6 to FIG. 13 may be collectively referred to understand the setting and relative position of the components of copper pillar bump structure in vertical direction during the manufacturing steps.

Figure 6:
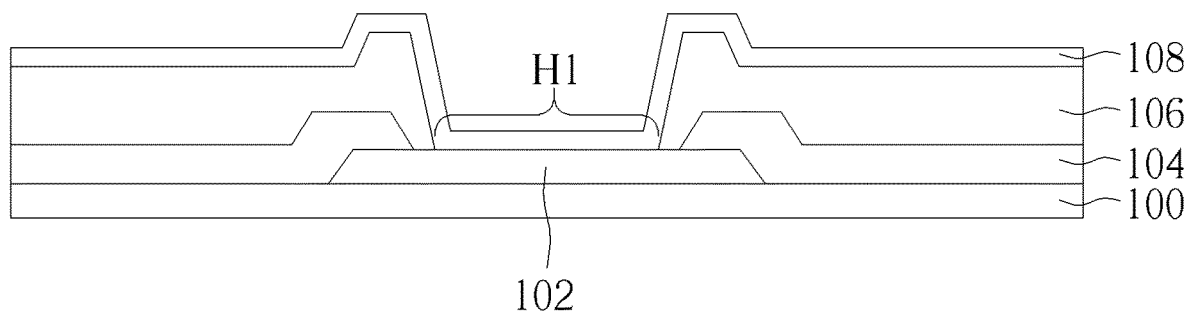
FIG. 6 to FIG. 13 are schematic cross-sections illustrating a process flow of manufacturing the copper pillar bump structure in accordance with the preferred embodiment of the present invention.

Please refer to FIG. 6. In step A1, a substrate 100 is first provided to serve as a basis for setting the copper pillar bump structure of present invention. The substrate 100 may be silicon substrate or silicon chip, with various components (ex. transistors, resistors, capacitors or memory) and interconnects (ex. conductive lines and vias) formed thereon through semiconductor processes. A bonding pad 102 is then formed on the substrate 100. The bonding pad 102 may be an aluminum bonding pad, which is electrically connected to interconnects (such as a top metal layer) inside the substrate 100 to serve as an I/O terminal for the circuit. The bonding pad 102 may be formed on the substrate 100 through PVD method like sputtering or evaporation and then be patterned through photolithography process. After the bonding pad 102 is formed, a passivation layer 104 is formed on the bonding pad 102 and substrate 100. The material of passivation layer 104 may be silicon nitride ($Si_3O_4$) or silicon oxide ($SiO_2$), which may be formed through CVD or PECVD. An opening H1 is then formed in the passivation layer 104 through photolithography process to expose the bonding pad 102 below. After the passivation layer 104 is formed, a polyimide (PI) layer 106 is then formed on the passivation layer 104 and bonding pad 102. The polyimide layer 106 may be formed by spin-coating method, and the opening H1 is then formed in the polyimide layer 106 through photolithography process to expose the bonding pad 102 below. After the polyimide layer 106 is formed, a conformal under-bump metallization layer 108 is formed on the polyimide layer 106 and bonding pad 102. The material of under-bump metallization layer 108 may be metal like chromium (Cr), copper (Cu), titanium (Ti) or nickel (Ni), or the alloy thereof, or the multilayer structure thereof, which may be conformally formed on the substrate 100 through PVD method like sputtering or evaporation. Parts of under-bump metallization layer 108 would directly contact the exposed bonding pad 102.

Figure 7:
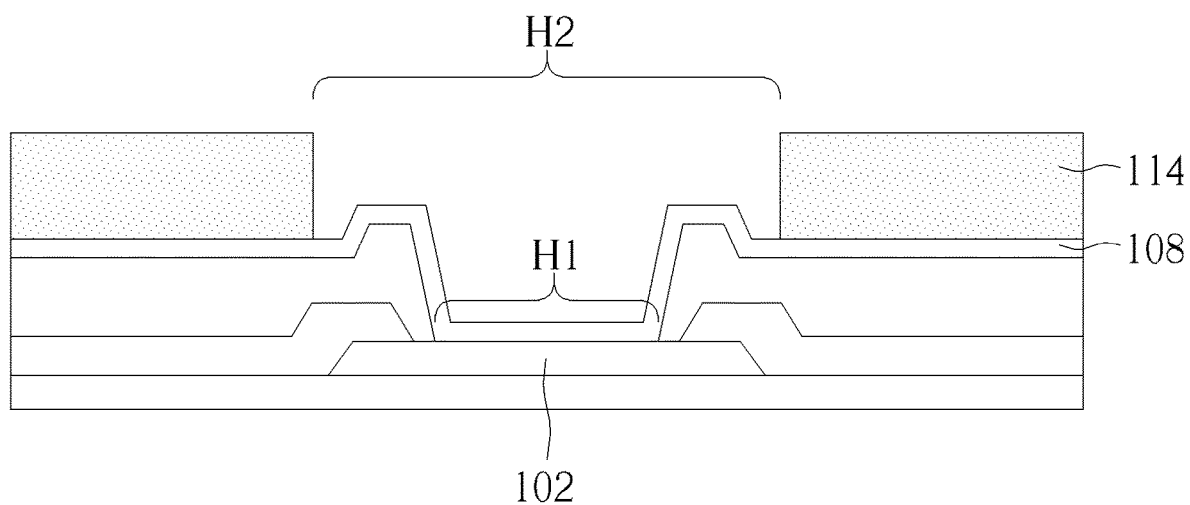

Please refer to FIG. 7. In step A2, a first photoresist 114 is coated on the under-bump metallization layer 108, and a first copper pillar pattern H2 is formed in the first photoresist 114 through photolithography process to expose the under-bump metallization layer 108 below. Generally, the first copper pillar pattern H2 would completely overlap the opening H1 and the bonding pad 102 below in a direction vertical to the substrate. The first photoresist 114 serves as a mask in later electroplating processes, while the first copper pillar pattern H2 defines the pattern of lower copper pillar to be formed later. The shape of horizontal cross-section of first copper pillar pattern H2 may include any geometrical shape, such as circle or square.

Figure 8:
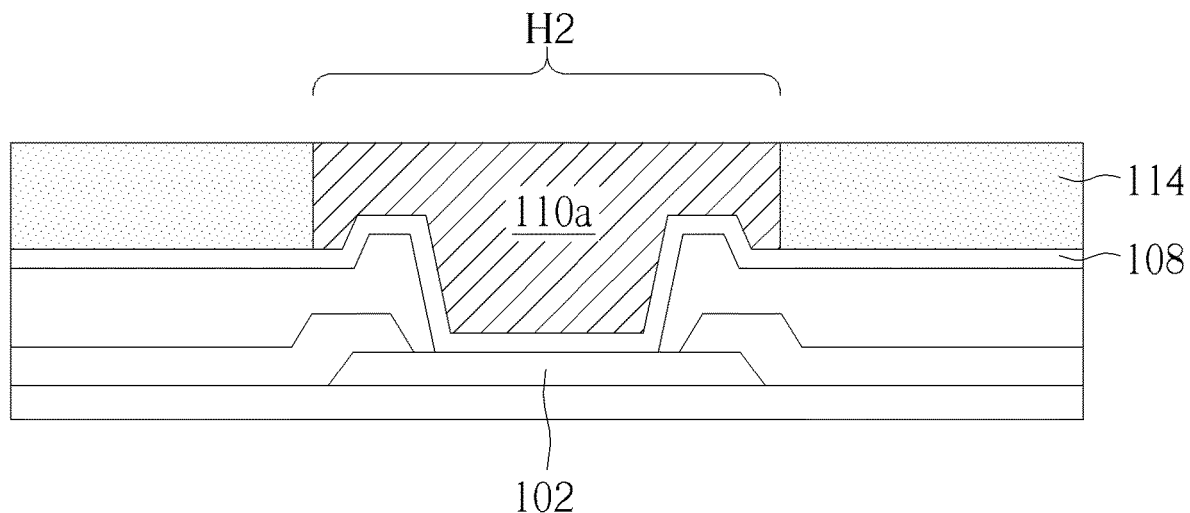

Please refer to FIG. 8. In step A3, a first electroplating process is performed using the first photoresist 114 as a mask to form the lower part 110a of copper pillar 110. The lower part 110a of copper pillar 110 is formed on the under-bump metallization layer 108 in the first copper pillar pattern H2 defined by the first photoresist 114 and is provided with a flat surface. The shape of horizontal cross-section of the lower part 110a of copper pillar 110 may include any geometrical shape, such as circle or square.

Figure 9:
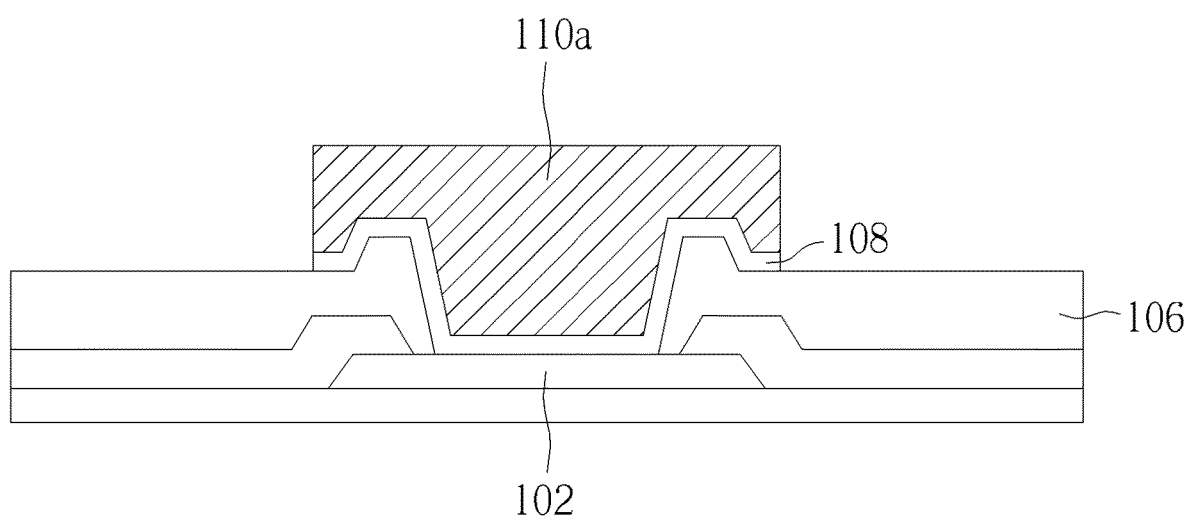

Please refer to FIG. 9. In step A4, the first photoresist 114 is removed to expose the under-bump metallization layer 108 below (not shown in FIG. 9). An etching process is then performed to remove the exposed under-bump metallization layer 108 and expose the underlying polyimide layer 106. In this way, it can be seen that the lower part 110a of copper pillar 110 completely overlaps the under-bump metallization layer 108 below in a direction vertical to the substrate.

Figure 10:
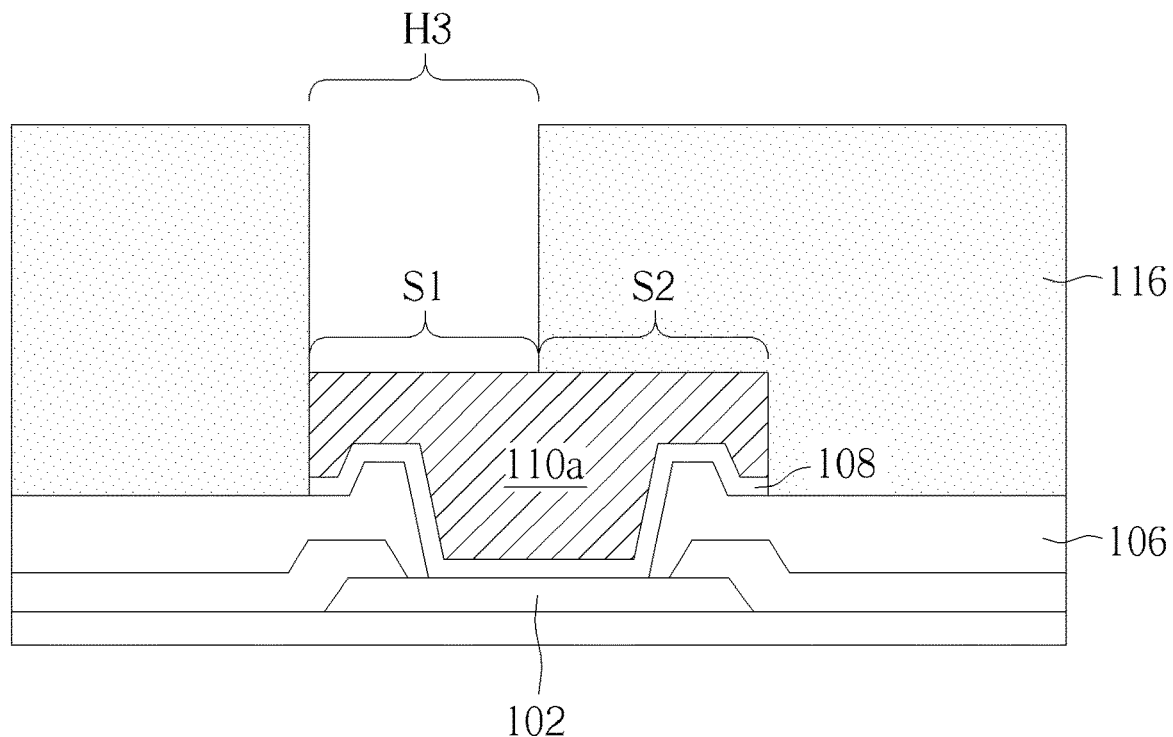

Please refer to FIG. 10. After the first photoresist 114 and the exposed under-bump metallization layer 108 are removed, in the same way of step A4, a second photoresist 116 is formed on the polyimide layer 106 and the lower part 110a of copper pillar 110, and a second copper pillar pattern H3 is formed in the second photoresist 116 to exposes the lower part 110a of copper pillar 110 through photolithography process. In the embodiment of present invention, the second photoresist 116 would cover parts of the lower part 110a of copper pillar 110, such as the second upper surface S2 of the lower part 110a of copper pillar 110, and expose the first upper surface S1. The horizontal cross-sections of the first upper surface S1 and the second upper surface S2 may be in a shape as the one shown in the embodiment of FIG. 2A or FIG. 4. For example, the second upper surface S2 covered by the second photoresist 116 may be a quarter circle, a half circle, two diagonally opposite quarter circles or an inner circle of concentric circle structure. The second photoresist 116 may function as a mask in later electroplating process, while the second copper pillar pattern H3 defines an upper copper pillar pattern to be formed later.

Figure 11:
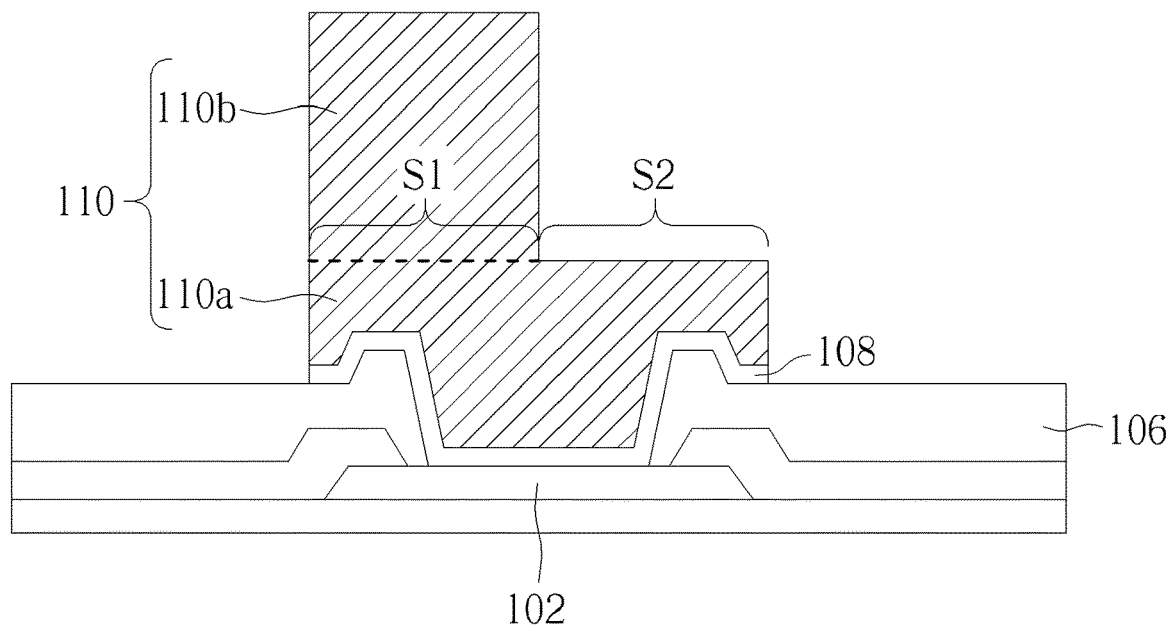

Please refer to FIG. 11. In step A5, a second electroplating process is performed using the second photoresist 116 as a mask to form the upper part 110b of copper pillar 110. The second photoresist 116 is removed after the upper part 110b of copper pillar 110 is formed to expose the polyimide layer 106. The upper part 110b of copper pillar 110 is formed on the lower part 110a of copper pillar 110 in the second copper pillar pattern H3 defined by the second photoresist 116 (i.e. on the first upper surface S1) and is provided with a flat surface. The upper part 110b of copper pillar 110 completely overlaps the first upper surface S1 of the lower part 110a of copper pillar 110 in a direction vertical to the substrate.

Figure 12:
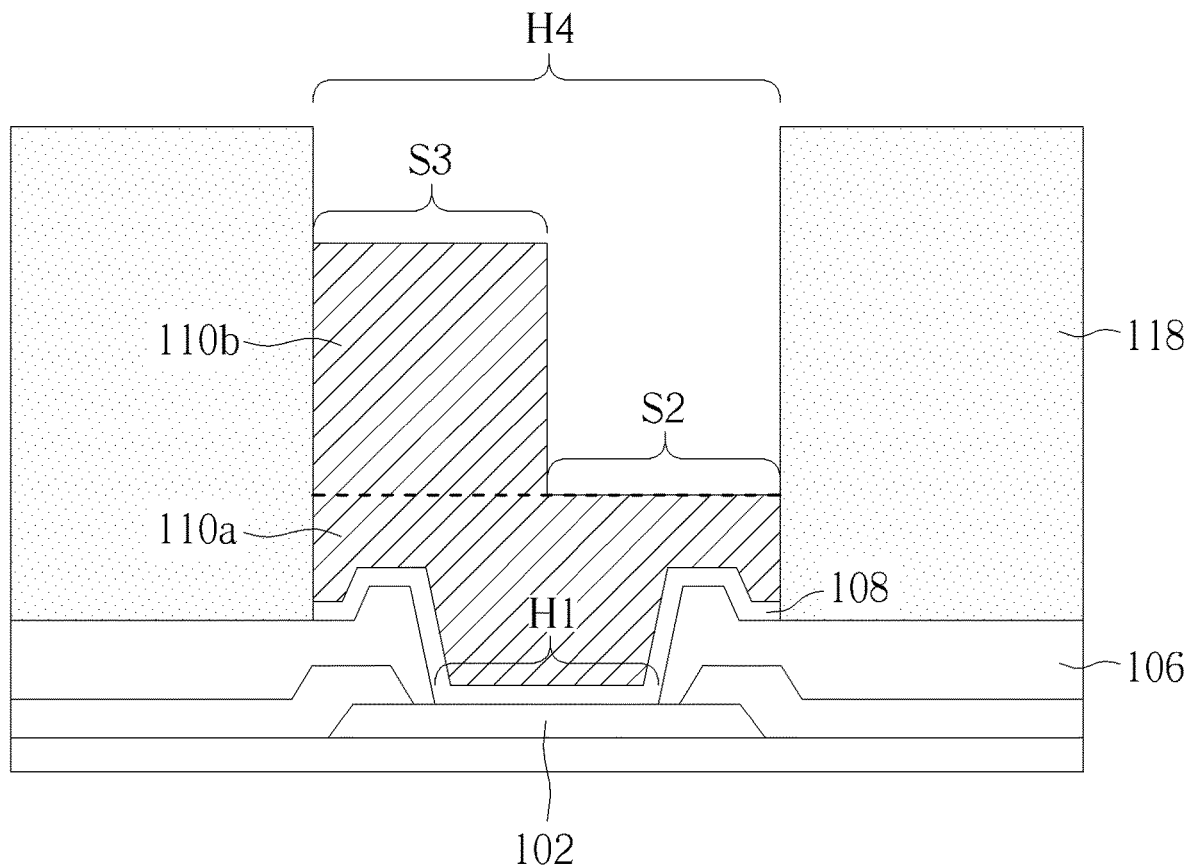

Please refer to FIG. 12. After the upper part 110b of copper pillar 110 is formed and the second photoresist 116 is removed, in step A6, a third photoresist 118 is formed on the exposed polyimide layer 106, and a metal bump pattern H4 is formed in the third photoresist 118 through photolithography process to expose the copper pillar 110 below, including the upper part 110b and lower part 110a thereof. In the embodiment of present invention, the third photoresist 118 would expose entire horizontal surface of the copper pillar 110, including the top surface S3 of the upper part 110b and the second upper surface S2 of the lower part 110a of copper pillar 110. The third photoresist 118 would function as a mask in later electroplating process, while the metal bump pattern H4 defines the pattern of metal bump to be formed later. The height of third photoresist 118 is preferably higher than a top end of the metal bump to be formed in later processes.

Figure 13:
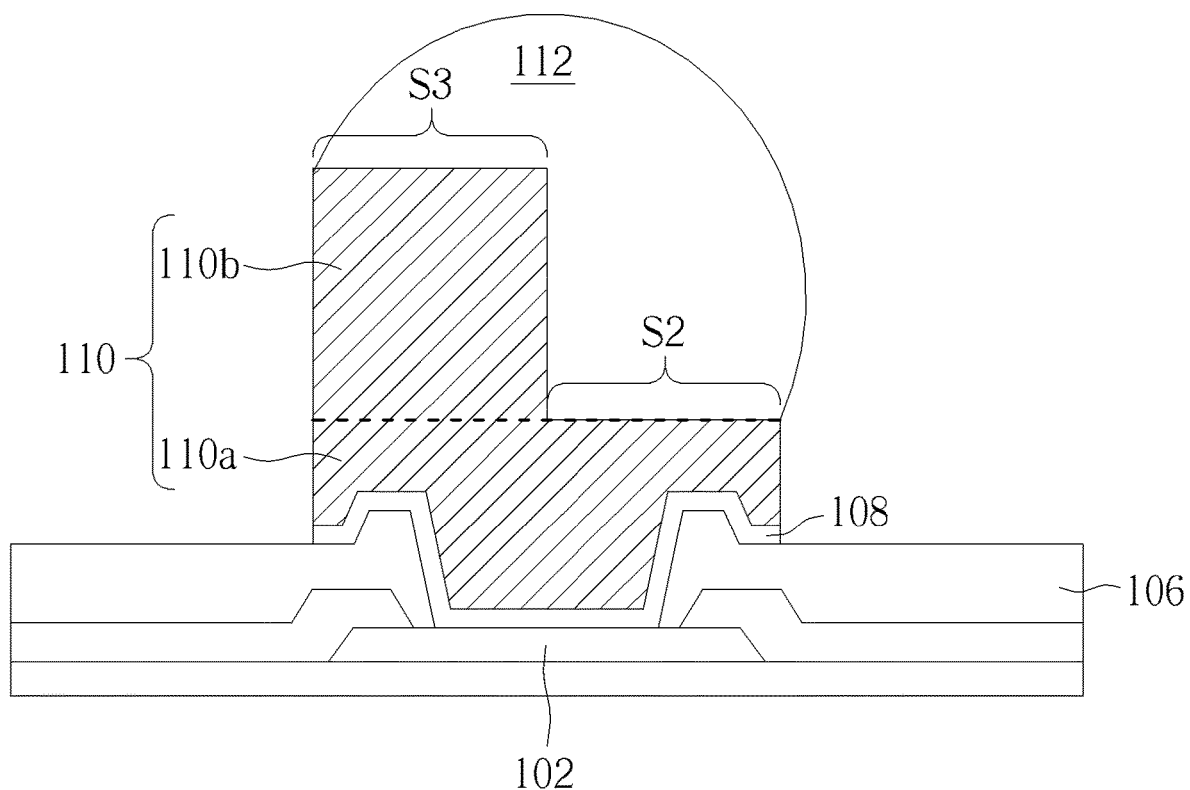

Lastly, please refer to FIG. 13. In step A7, a third electroplating process is performed using the third photoresist 118 to form metal bump 112 on the copper pillar 110, and the third photoresist is removed after the metal bump 112 is formed. The material of metal bump 112 may be tin-lead alloy or lead-free eutectic alloy like tin-silver, tin-zinc or tin-copper alloy. The formed metal bump 112 may then be reshaped into a sphere through reflowing process in order to facilitate the flip chip bonding process later. In the embodiment of present invention, parts of the metal bump 112 directly contact the top surface S3 of upper part 110b of copper pillar 110, and parts of the metal bump 112 directly contact the second upper surface S2 of the lower part 110a and the sidewalls of upper part 110b of copper pillar 110. In this way, in comparison to conventional skills, parts of the copper pillar 110 are replaced by the metal bump 112, and the volume ratio of metal bump 112 in the whole copper pillar bump structure would be much larger than the one of solder bump in conventional skills. The advantage of the aforementioned design of present invention is that excess stress induced in reflow soldering process may be absorbed at one end of the metal bump of copper pillar bump structure through the metal bump 112 with increased volume and ratio, so as to prevent the delamination or crack of vulnerable adjacent layer structures (ex. porous ultra-low k dielectric layer below the bonding pad 102) or prevent the crack of polyimide layer 106, thereby improving the reliability of package structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A copper pillar bump structure, comprising:
   a substrate;
   a bonding pad on said substrate;
   a passivation layer covering said substrate and exposing said bonding pad;
   a copper pillar on said passivation layer and said bonding pad and connecting directly with said bonding pad, wherein said copper pillar is provided with an upper part and a lower part, an upper surface of said lower part is provided with a first upper surface and a second upper surface, and said second upper surface is at one side of said first upper surface, and said upper part of said copper pillar is on said first upper surface of said lower part; and
   a metal bump on said copper pillar, wherein parts of said metal bump directly contact said second upper surface of said lower part of said copper pillar.

2. The copper pillar bump structure of claim 1, further comprising a polyimide layer on said passivation layer and exposing said bonding pad, and said copper pillar is on said polyimide layer.

3. The copper pillar bump structure of claim 1, wherein a material of said metal bump is solder material.

4. The copper pillar bump structure of claim 1, wherein an area of said parts of said metal bump directly contacting said second upper surface of said lower part of said copper pillar is ¼ of a total area of said upper surface of said lower part.

5. The copper pillar bump structure of claim 1, wherein said first upper surface is annulus, and said second upper surface is a circle portion in said annulus.

6. The copper pillar bump structure of claim 5, wherein a radius of said second upper surface of said circle is ½ to ⅔ of an outer radius of said upper surface of said lower part.

* * * * *